United States Patent [19]

Sample

[11] Patent Number: 5,114,353
[45] Date of Patent: May 19, 1992

[54] MULTIPLE CONNECTOR ARRANGEMENT FOR PRINTED CIRCUIT BOARD INTERCONNECTION

[75] Inventor: Stephen P. Sample, Mountain View, Calif.

[73] Assignee: Quickturn Systems, Incorporated, Mountain View, Calif.

[21] Appl. No.: 664,417

[22] Filed: Mar. 1, 1991

[51] Int. Cl.⁵ ............................................... H05K 1/00
[52] U.S. Cl. ........................................ 439/65; 439/74; 361/413
[58] Field of Search ..................... 439/55, 59, 62, 65, 439/74, 60, 79; 361/400, 395, 401, 405, 406, 419, 420, 412, 413, 414, 415

[56] References Cited

U.S. PATENT DOCUMENTS

| | | | |
|---|---|---|---|
| 4,790,762 | 12/1988 | Harms et al. | 439/62 |
| 4,885,482 | 12/1989 | Sharp et al. | 439/62 |
| 4,934,941 | 6/1990 | Okada | 439/60 |
| 4,985,808 | 1/1991 | Zernov | 361/406 |
| 5,017,146 | 5/1991 | Uehara et al. | 439/65 |

Primary Examiner—David L. Pirlot
Attorney, Agent, or Firm—Kenneth D'Alessandro

[57] ABSTRACT

A connector arrangement for connecting together a plurality of circuit boards includes a plurality of side insertion connectors of a first mating type are mounted parallel to one another on parallel finger portions extending from body portions of one or more first circuit boards. A plurality of side insertion type connectors of a second mating type are mounted on a plurality of second circuit boards. The side insertion type connectors of the second type are mounted at positions and orientations on the second circuit boards chosen such that they are engageable with the mating connectors of the first type mounted on the first circuit boards. When connected by the mating connectors, the first and second circuit boards will be disposed at right angles to one another. The parallel extended fingers of the first circuit board are spaced apart from one another by a distance which is at least sufficient to accommodate the height of the second circuit boards including whatever components are mounted thereon plus the insertion travel distance of the mating connectors.

2 Claims, 3 Drawing Sheets

MULTIPLE CONNECTOR ARRANGEMENT FOR PRINTED CIRCUIT BOARD INTERCONNECTION

BACKGROUND OF THE INVENTION

1. Field Of The Invention

The present invention relates to electrical connectors. More specifically, the present invention relates to an electrical connector arrangement for interconnecting two or more printed circuit boards.

2. The Prior Art

There are numerous connectors available in the prior art for connecting together two or more printed circuit boards. As the circuitry contained on such circuit boards has become more dense and more complex, the number of required interconnections between printed circuit boards has also grown. At the circuit board level, current commercial connector technology limits the pin count to approximately 3,000 pins even if the three edges of the circuit board are filled with connectors. At some point, the number of interconnections required to be made between circuit boards becomes too large to practically employ currently available connector arrangements, such as flat ribbon cable, between two circuit boards.

A need therefore exists to provide a connector arrangement for use in making a large number of interconnections between two circuit boards which overcomes the present limitations of prior art connectors.

BRIEF DESCRIPTION OF THE INVENTION

In accordance with a presently preferred embodiment of the present invention, a connector arrangement for connecting together a plurality of circuit boards, a plurality of connectors of a first mating type are mounted parallel to one another on parallel finger portions extending from body portions of one or more first circuit boards.

The connectors of the first mating type are of the side insertion type, i.e., the direction of insertion with a mating connector of a second mating type is in a plane parallel with the plane of the circuit board upon which they are mounted.

A plurality of side insertion type connectors of a second mating type are mounted on a plurality of second circuit boards. The side insertion type connectors of the second type are mounted at positions and orientations chosen such that the connectors of the first and second types on the first and second circuit boards can mate with one another.

When connected by the mating connectors, the first and second circuit boards will be disposed at right angles to one another. The parallel extended fingers of the first circuit board are spaced apart from one another by a distance which is at least sufficient to accommodate the height of the second circuit boards (including whatever components are mounted thereon) plus the insertion travel distance of the mating connectors. The present invention allows utilization of the entire area of a printed circuit board for connectors, not just its edges.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
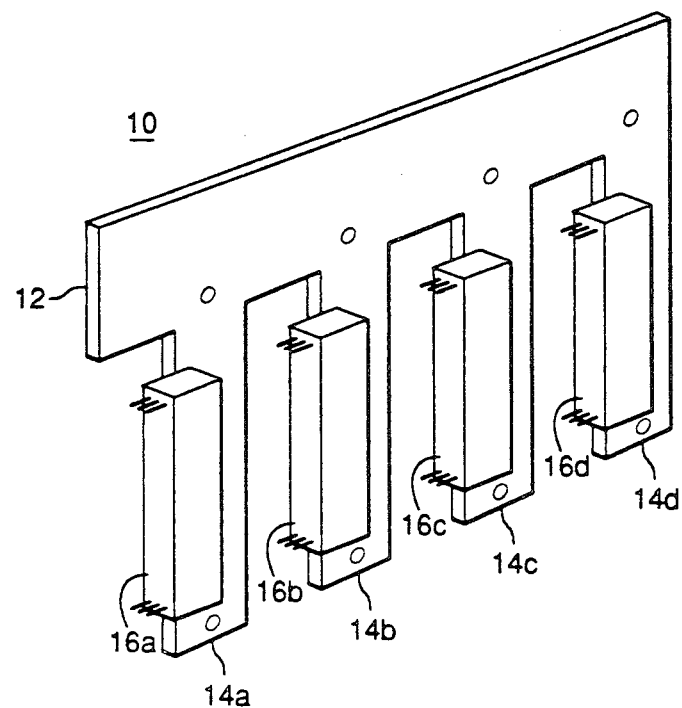
FIG 1. is a perspective view of a first circuit board with mating connectors mounted thereon according to a presently preferred embodiment of the invention.

Referring first to FIG. 1, a perspective view of a circuit board 10 of a first type useful in the connector and circuit board arrangement of the present invention. Circuit board 10 includes a body portion 12 from which a plurality of spaced-apart parallel fingers extend. In the embodiment depicted in FIG. 1, fingers 14a, 14b, 14c, and 14d are shown, but those of ordinary skill in the art will readily appreciate that the number of spaced-apart fingers provided on a circuit board constructed in accordance with the teachings of the present invention is purely a matter of design choice depending upon the number of interconnections to be made.

A plurality of mating connectors of a first type, indicated by reference numerals 16a–16d, are mounted on spaced-apart extending fingers 14a–14d. These connectors 16a–16d include a plurality of connector nodes. As is known in the art, mating connectors may usually be identified as one of two types, male and female. These connectors mate with one another in the manner well known in the art. In accordance with the teachings of the present invention, either male or female connectors may be mounted on circuit board 10. Whichever type of connector (i.e., male or female) is used will be referred to herein as a mating connector of a first type and those of ordinary skill in the art will so recognize this terminology. The connectors 16a–16d of the first mating type are of the side insertion type, i.e., the direction of insertion with a mating connector of a second mating type is in a plane parallel with the plane of the circuit board 10 upon which they are mounted.

In a presently preferred embodiment, circuit board 10 may be a multi-layer printed circuit board having a plurality of conductive traces (not shown in FIG. 1) used to connect together selected ones of the connector nodes together with other electronic components mounted thereon (not shown), if desired. Those of ordinary skill in the art will readily recognize from the disclosure herein that circuit board 10 and its associated mating connectors 16a–16d provide a high density interconnect capability. The actual density of the interconnect capability of the circuit board interconnect system of the present invention will, of course, depend on the number of spaced apart extending fingers and the number of mating connectors of the first type mounted on circuit board 10.

Figure 2:
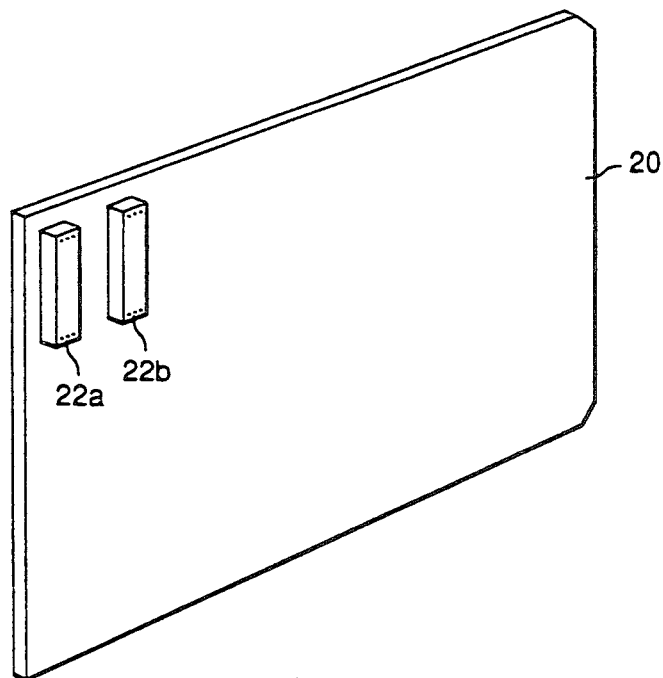
FIG. 2 is a perspective view of a second circuit board with mating connectors, mating with the connectors on the first circuit board depicted in FIG. 1, according to a presently preferred embodiment of the invention.

Circuit board 10 of FIG. 1 is useful for providing large numbers of interconnections between one or more circuit boards of a second type, such as circuit board 20 shown in FIG. 2. In a presently preferred embodiment, circuit board 20 may also be a multilayer printed circuit board as is known in the art. One or more mating connectors of a second type, shown as connectors 22a and 22b in FIG. 2, are top insertion type connectors and are located on circuit board 20. As used herein, a mating connector of the second type is a connector opposite in type (i.e., male or female) from the first type and mates with a corresponding mating connector of the first type by having the same number of connector nodes. The connector nodes of the mating connectors 22a and 22b of the second type may be connected to circuit nodes of electronic circuits (not shown) disposed on circuit board 20 via a plurality of conductive traces on circuit board 20. Those of ordinary skill in the art will recognize that, although only two connectors 22a and 22b are shown, the number of connectors disposed on circuit board 20 in an actual embodiment of the invention will depend on the number of interconnections to be made.

Figure 3:
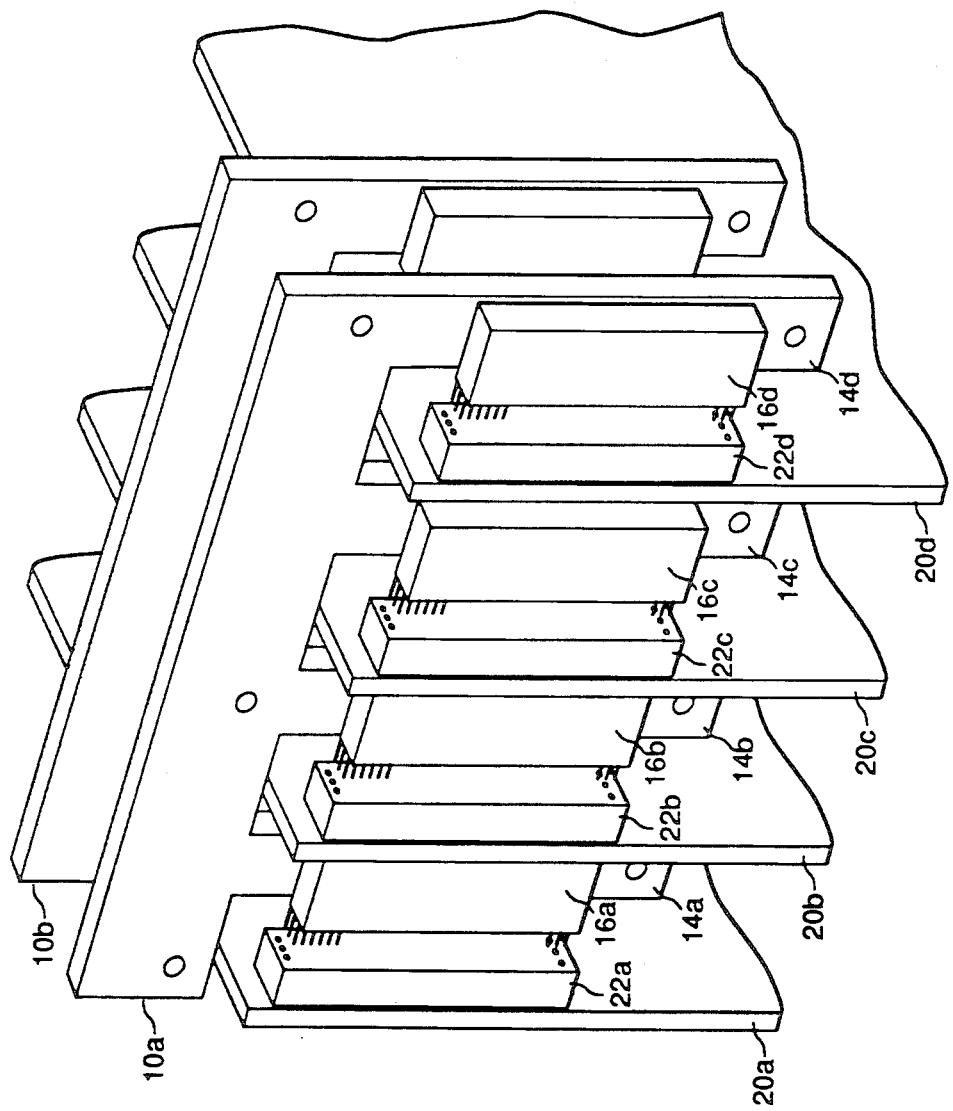
FIG. 3 is a perspective view of the connector and circuit board arrangement of the present invention including circuit boards as shown in FIGS. 1 and 2 with their mating connectors shown in the extracted position.

Referring now to FIG. 3, a perspective view of the connector and circuit board arrangement of the present invention including circuit boards 10 and 20 is depicted with the mating connectors shown in the extracted position. As can be seen from FIG. 3, when connected by the mating connectors, the first and second circuit boards 10 and 20 will be disposed at right angles to one another. The parallel extended fingers 14a–14d on first circuit board 10 must be spaced from one another by a distance which is at least sufficient to accommodate the height of the second circuit boards (including whatever components are mounted thereon) plus the insertion travel distance of the mating connectors. From FIG. 3, it may also be seen that connectors 16 and 22 are disposed at locations which enable their engagement with one another.

Figure 4:
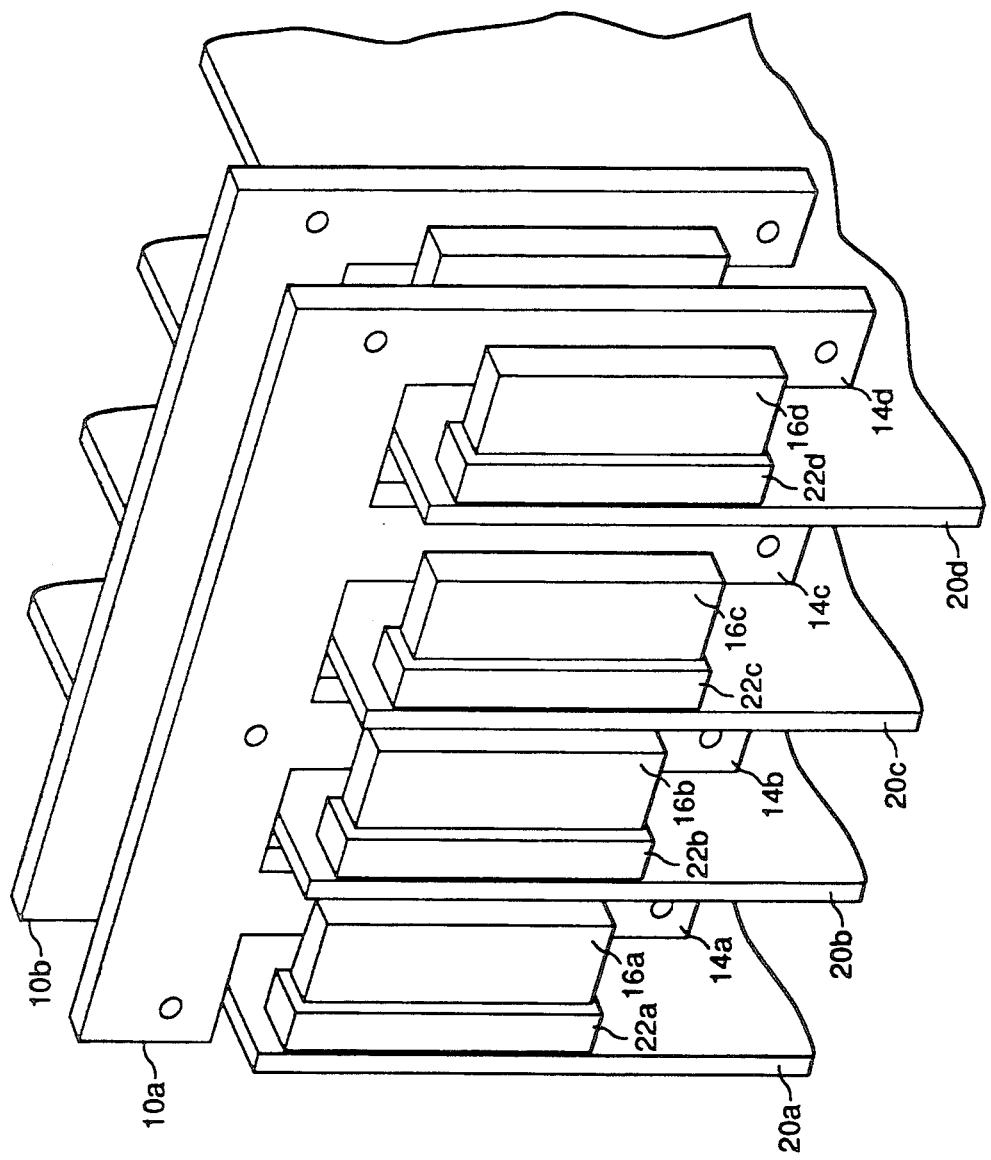
FIG. 4 is a perspective view of the connector and circuit board arrangement of the present invention as shown in FIGS. 1 and 2 with their mating connectors shown in the inserted position.

Referring now to FIG. 4, a perspective view of the connector and circuit board arrangement of the present invention including circuit boards 10 and 20 is depicted with the mating connectors 16 and 22 shown in the inserted position. From an examination of the figures, it will be apparent to those of ordinary skill in the art that a plurality of connectors 16 of the first mating type may be mounted parallel to one another on parallel spaced apart extending fingers 14a–14d.

Those of ordinary skill in the art will realize that, while only two circuit boards 10a and 10b of the first type and four circuit boards 20a, 20b, 20c, and 20d are shown in FIGS. 3 and 4, the number of such circuit boards, as well as the number of connectors disposed on each circuit board, depends upon the particular application.

While embodiments and applications of this invention have been shown and described, it would be apparent to those skilled in the art that they are illustrative only, and not limiting, an many more modifications than mentioned above are possible without departing from the inventive concepts herein. The invention, therefore, is not to be restricted except in the spirit of the appended claims.

What is claimed is:

1. A system of circuit boards and connectors for accomplishing high density levels of electronic circuit interconnection, including:
   at least one circuit board of a first type, said at least one circuit board including a body portion and at least two finger portions extending from said body portion;
   a plurality of N-connection-node, side-insertion connectors of a first mating type mounted parallel to one another on said finger portions of said first circuit boards;
   at least two circuit boards of a second type, each of said circuit boards of said second type having a maximum profile height;
   a plurality of N-connection node top-insertion type connectors of a second mating type mounted on each of said at least two circuit boards of said second type, said top-insertion type connectors of the second type mounted at positions with respect to the positions of said side insertion connectors of the first mating type to allow mating therewith;
   said side-insertion connectors of said first mating type and said top-insertion type connectors of said second mating type having a characteristic insertion travel distance;
   said finger portions of said first circuit boards having an interfinger spacing distance at least equal to the sum of said maximum profile height and said insertion travel distance;
   said system of circuit boards being interconnectable by placing said at least one circuit board of said second type between adjacent fingers of said at least one circuit board of said first type and at an angle thereto and connecting said side-insertion connectors of said first mating type and said top-insertion type connectors of said second mating type.

2. A circuit board with connectors mounted thereon for accomplishing high density levels of electronic circuit interconnection, including:
   a body portion;
   at least two finger portions extending from said body portion, said fingers extending in a direction parallel to an axis;
   at least one N-connection-node, side-insertion connector of a first mating type mounted on each of said at least two finger portions of said circuit board, each of said at least one of said connectors located proximate to an edge of the one of said fingers on which it is mounted and disposed in an orientation parallel to said axis;
   said at least two finger portions spaced apart by a distance sufficient to allow for insertion and removal of mating connectors of a second mating type mounted on at least one other circuit board positioned in a plane lying at right angles to the plane of said circuit board.

* * * * *